(12) United States Patent
Greco

(10) Patent No.: US 7,368,302 B2
(45) Date of Patent: May 6, 2008

(54) DYNAMIC METAL FILL FOR CORRECTING NON-PLANAR REGION

(75) Inventor: Stephen E. Greco, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 353 days.

(21) Appl. No.: 10/908,128

(22) Filed: Apr. 28, 2005

(65) Prior Publication Data
US 2006/0246609 A1    Nov. 2, 2006

(51) Int. Cl.
H01L 21/00    (2006.01)
(52) U.S. Cl. .............. 438/5; 438/14; 257/E21.529
(58) Field of Classification Search ............ 438/5, 438/14; 257/E21.529
See application file for complete search history.

(56) References Cited

U.S. PATENT DOCUMENTS 5,763,955 A    6/1998    Findley et al.
5,928,960 A    7/1999    Greco et al.
6,140,234 A *  10/2000   Uzoh et al. .............. 438/678
6,664,188 B2   12/2003   Thomas
6,751,785 B1   6/2004    Oh
2002/0061645 A1  5/2002  Trivedi et al.
2003/0020141 A1  1/2003  Thomas
2003/0116858 A1  6/2003  Trivedi et al.
2003/0229881 A1* 12/2003  White et al. .............. 716/19
2004/0214442 A1 10/2004   Lee et al.

* cited by examiner

Primary Examiner—Bradley K Smith
(74) Attorney, Agent, or Firm—Lisa U. Jaklitsch; Hoffman, Warnick & D'Alessandro LLC

(57) ABSTRACT

Methods and a system are disclosed for correcting a non-planar region during fabrication of a semiconductor product on a wafer. The invention separates an exposure of at least a portion of a fill pattern on a resist from a product exposure so that the fill pattern can be adjusted to correct the non-planar region. In one embodiment, a determination of whether a fill pattern for a metal level above the non-planar region includes a portion over the non-planar region is made. Where a portion of the fill pattern is to be placed over the non-planar region, a pattern factor for exposure of the portion of the fill pattern on a resist is adjusted to correct the non-planar region.

20 Claims, 5 Drawing Sheets

DYNAMIC METAL FILL FOR CORRECTING NON-PLANAR REGION

BACKGROUND OF THE INVENTION

1. Technical Field

The present invention relates generally to semiconductor fabrication, and more particularly, to a method for correcting a non-planar region by dynamically placing fill patterns separate from the product exposure.

2. Related Art

The ability to achieve and maintain surface planarity is becoming increasingly important for modern semiconductor processing. Processing is separated into two portions: front-end-of-line (FEOL), which includes operations performed on the semiconductor wafer in the course of device manufacturing up to first metallization, and back-end-of-line (BEOL). As semiconductor wafers enter the BEOL processing for copper damascene processing, a certain amount of non-planarity exists from the FEOL processing. Further non-planarity is normally produced by the BEOL processing and is inherent to copper damascene. For example, areas with high copper pattern factors polish at higher rates because less insulator area exists to distribute the force from the chemical mechanical polishing (CMP) pad than areas with low copper pattern factors. The production of non-planarity due to these differing polish rates is commonly referred to as "dishing."

If high pattern factor regions are stacked on top of each other for several levels in a row, additive dishing effects can results in a region that is very low with respect to surrounding areas. It has been observed in such cases that long range peak to valley height differences across a chip can be approximately 3000 Å or more. Such severe height differences over a long range prevents sufficient planarization of, for example, anti-reflective coatings (ARC), underlayer resists or photoresist films. This situation has consequences for lithography since 3000 Å is on the order of the depth of focus for thin wire levels on, for example, 90 nm technologies.

Conventional lithography steppers generally scan the image in a slit which runs across the chip, continually reading the spatial position of the top of the resist along the slit with multiple optical sensors (the sensors basically detect the top of the resist). The instantaneous plane of best focus is decided by the stepper's software and the exposure plane is continually adjusted as the image is scanned. Since the image is focused in a plane but the wafer is non-planar across the chip by 3000 Å or more, some areas will be in much better focus than others areas. Poor lithography can result in the areas where the resist was exposed with the most "out of focus" conditions. For example, the poor focus areas can be so bad that the resist is not completely developed away in areas where it should be developed away. In other cases, the focus is not as poor but poor enough to result in (at least) critical dimension differences for minimum dimension features.

A severely dished area caused by cumulative dishing of several levels can also result in a metal "puddle" at the next level, depending on the design at the next level. A "puddle" results where CMP is unable to remove all of the metal without severe overpolish due to the depression. Even if enough metal is cleared to prevent hard shorts, the lines in this region could be taller than nominal, contributing to the spread in resistance tolerance.

The peak to valley topography can vary from run to run because of processing variations. For example, if one lot receives a longer effective liner overpolish (e.g., because liner thickness was at the low end of the specification or because the liner polish rate was at the high end of the specification, etc.), then more dishing can result. Center-to-edge differences in planarity after CMP can be also be significant, resulting either from non-uniformities inherent to CMP or from non-uniformities originating in other sectors such as metal deposition or insulator deposition. These center-to-edge differences can vary from run to run, or even from wafer to wafer within a run. Linewidth variations from run to run can also affect the amount of dishing in a certain region of the chip. For example, consider that a minimum equal line/space array at a second copper metallization level with a pitch of 280 nm and a nominal metal line width of 140 nm may vary from a low of approximately 39% pattern factor to a high of approximately 61% pattern factor over the allowable range of final critical dimension (e.g., approximately 110 to approximately 170 nm).

A number of approaches have been attempted to address the above-identified problems. In one approach, design restrictions are implemented on one level. Typically, this approach is implemented by imposing various design rules to narrow the range of allowable pattern factors. In another approach, design restrictions are applied to multiple levels. In this case, rules which prevent the placement of high pattern factors on top of one another may be imposed. Unfortunately, both of the above-described approaches can decrease design flexibility and circuit density.

In another approach, "holes" are placed in the metal in wide metal lines to reduce dishing. This approach is generally disadvantageous for high performance designs because it increases the resistance of lines, thus necessitating making lines even wider to account for the resistance increase. An analogous approach requires designers to break wide lines into narrower parallel lines, which is essentially another type of design restriction.

Another common technique places metal fill shapes on the product reticle between circuit wiring, where they can fit, to even out the pattern factor. The fill shapes are usually larger than the critical dimension and kept far enough away from circuit wiring so that there is no chance of shorting the fill shapes to circuit wiring. The metal fill helps to even out the pattern factor across the chip. The extent of the "evening out" achievable depends on the design, and also on the size of the pattern factor check box used. An improvement on this approach implements "smart" metal fill. In this case, instead of just placing fill in a standard fill pattern at a set pattern factor everywhere possible, an algorithm is used that examines the design environment and varies the metal fill on the product exposure to achieve better planarity results. One goal of the algorithm may be to even out the pattern factor as much as possible on a single level. Another goal of the algorithm might be to "compensate" for a high pattern factor area on one level by "lowering" the pattern factor directly above it at the next level, i.e., by essentially not placing metal fill there or placing a lower density metal fill there. The algorithm may also modulate the density of the metal fill by making the fill shapes larger or smaller, moving them further apart or closer together, etc. This approach, however, as well as all of the above-described approaches, cannot be used to make any adjustments to account for varying amounts of topography from lot-to-lot, from wafer-to-wafer within a lot or from edge-to-center (chip-to-chip) on a single wafer because once the metal fill pattern is selected, it is set for the particular product exposure and cannot be changed.

Finally, in another approach, planarization by CMP after interlayer dielectric (ILD) deposition can help to some extent, but this method cannot planarize well over very long distances. This approach also adds significant cost, and can cause additional defects.

In view of the foregoing, there is a need in the art for a way to use metal fill to improve planarization that does not suffer from the problems of the related art.

SUMMARY OF THE INVENTION

The invention includes methods and a system for correcting a non-planar region during fabrication of a semiconductor product on a wafer. The invention separates an exposure of at least a portion of a fill pattern on a resist from a product exposure so that the fill pattern can be adjusted to correct the non-planar region. In one embodiment, a determination of whether a fill pattern for a metal level above the non-planar region includes a portion over the non-planar region is made. Where a portion of the fill pattern is to be placed over the non-planar region, a pattern factor for exposure of the portion of the fill pattern on a resist is adjusted to correct the non-planar region.

A first aspect of the invention is directed to a method of correcting a non-planar region during fabrication of a semiconductor product on a wafer, the method comprising the steps of: determining whether a fill pattern for a metal level above the non-planar region includes a portion over the non-planar region; and in the case that a portion of the fill pattern is to be placed over the non-planar region, adjusting a pattern factor for exposure of the portion of the fill pattern on a resist to correct the non-planar region.

A second aspect of the invention includes a system for correcting a non-planar region during fabrication of a semiconductor product on a wafer, the system comprising: means for determining whether a fill pattern for a metal level above the non-planar region includes a portion over the non-planar region; and means for adjusting a pattern factor for exposure of the portion of the fill pattern on a resist to correct the non-planar region in the case that a portion of the fill pattern is to be placed over the non-planar region.

A third aspect of the invention related to a method of correcting a non-planar region during fabrication of a semiconductor product on a wafer, the method comprising the steps of: conducting a product exposure of a resist for a metal level to be formed over an underlying metal level including the non-planar region; and conducting a separate exposure of the resist with at least a portion of a fill pattern for the metal level, the portion including fill above the non-planar region, to correct the non-planar region.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

The description includes the following headings for clarity purposes only: I. General Overview, II. System Overview, III. Operational Methodology, and IV. Conclusion.

I. General Overview

The invention includes a method of correcting a non-planar region during fabrication of a semiconductor product on a wafer by dynamically placing metal fill shapes for a level of a semiconductor product in a way that allows for correction of the non-planar region, e.g., depressions or bumps, in an underlying level. In one embodiment, the invention places metal fill shapes on a separate reticle from the product reticle. The metal fill shapes are exposed in a second exposure step in the same resist layer that is used for the product exposure. In this manner, the metal fill can be modulated from lot to lot, or from wafer to wafer within a lot or from edge to center (chip to chip) on a single wafer, in order to minimize non-planar regions.

In the preferred embodiment, the modulation is accomplished by using a focus sensitive lithography process for the metal fill exposure, in order to control the size of the metal fill (and therefore the metal fill pattern factor). Even if modulation from lot to lot, wafer to wafer, or chip to chip is not required, the invention provides a means of adjusting the metal fill for better planarity without having to order a new product reticle. Although the additional exposure step will decrease lithography throughput somewhat, it is done with a reticle that has only the non-minimum fill images (which are typically not minimum CD for that level). The reticle is less expensive to make than a product reticle because it does not require extensive inspection of critical structures as for a product reticle, and small defects in the fill areas do not need to be repaired. Also, alignment between the fill shapes and the product pattern is not critical since the fill shapes are typically at a very safe distance from the product pattern.

II. System Overview

Figure 1:
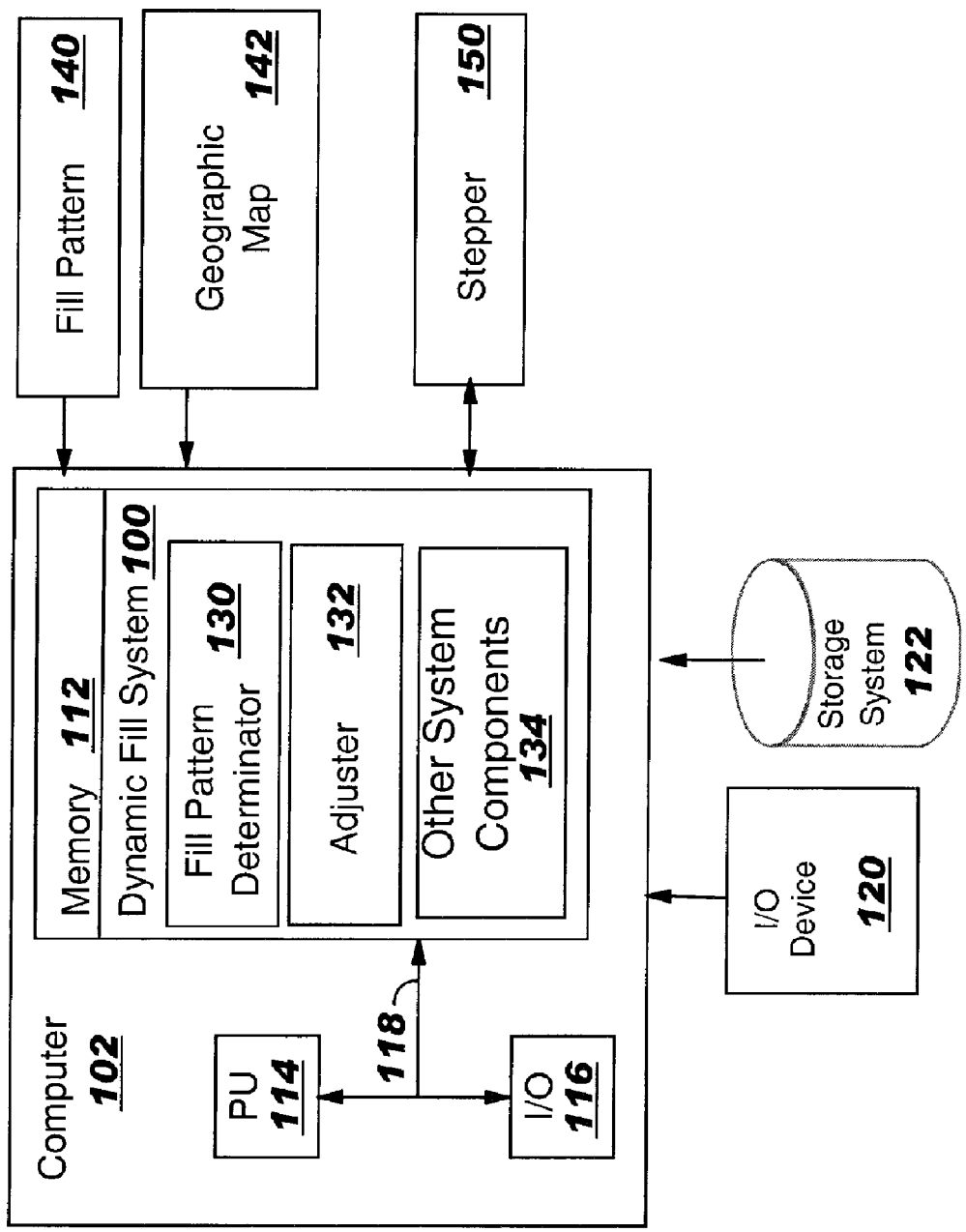
FIG. 1 shows a block diagram of a dynamic fill system according to the invention.

With reference to the accompanying drawings, FIG. 1 is a block diagram of a dynamic fill system 100 in accordance with the invention. System 100 is shown implemented on computer 102 as computer program code. To this extent, computer 102 is shown including a memory 112, a processing unit 114, an input/output (I/O) interface 116, and a bus 118. Further, computer 102 is shown in communication with an external I/O device/resource 120 and a storage system 122. In general, processing unit 114 executes computer program code, such as system 100, that is stored in memory 112 and/or storage system 122. While executing computer program code, processing unit 114 can read and/or write data to/from memory 112, storage system 122, and/or I/O device 120. Bus 118 provides a communication link between each of the components in computer 102, and I/O device 120 can comprise any device that enables user to interact with computer 102 (e.g., keyboard, pointing device, display, etc.).

Alternatively, a user can interact with another computing device (not shown) in communication with computer 102. In this case, I/O interface 116 can comprise any device that enables computer 102 to communicate with one or more other computing devices over a network (e.g., a network system, network adapter, I/O port, modem, etc.). The network can comprise any combination of various types of communications links. For example, the network can comprise addressable connections that may utilize any combination of wireline and/or wireless transmission methods. In this instance, the computing devices (e.g., computer 102) may utilize conventional network connectivity, such as Token Ring, Ethernet, WiFi or other conventional communications standards. Further, the network can comprise one or more of any type of network, including the Internet, a wide area network (WAN), a local area network (LAN), a virtual private network (VPN), etc. Where communications occur via the Internet, connectivity could be provided by conventional TCP/IP sockets-based protocol, and a computing device could utilize an Internet service provider to establish connectivity to the Internet.

Computer 102 is only representative of various possible combinations of hardware and software. For example, processing unit 114 may comprise a single processing unit, or be distributed across one or more processing units in one or more locations, e.g., on a client and server. Similarly, memory 112 and/or storage system 122 may reside at one or more physical locations. Memory 112 and/or storage system 122 can comprise any combination of various types of computer-readable media and/or transmission media including magnetic media, optical media, random access memory (RAM), read only memory (ROM), a data object, etc. I/O interface 116 can comprise any system for exchanging information with one or more I/O devices. Further, it is understood that one or more additional components (e.g., system software, math co-processing unit, etc.) not shown in FIG. 1 can be included in computer 102. To this extent, computer 102 can comprise any type of computing device such as a network server, a desktop computer, a laptop, a handheld device, a mobile phone, a pager, a personal data assistant, etc. However, if computer 102 comprises a handheld device or the like, it is understood that one or more I/O devices (e.g., a display) and/or storage system 122 could be contained within computer 102, not externally as shown.

Figure 3:
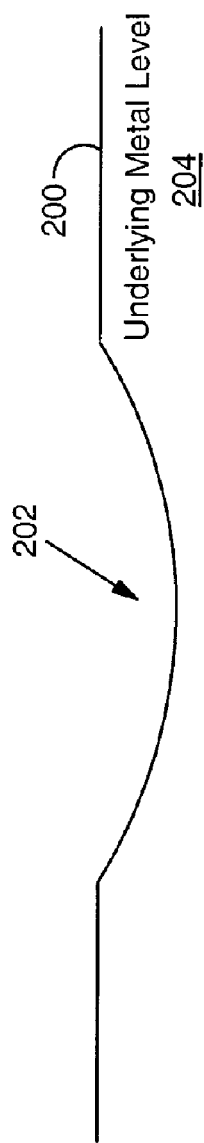
FIG. 3 shows a non-planar region in a wafer surface in the form of a depression.

As discussed further below, system 100 is shown including a fill pattern determinator 130, a fill pattern adjuster 132 and other system components 134. Other system components 134 may include any other functionality required to carry out the invention such as communications or translation modules, etc. As shown, system 100 is implemented as a standalone system; however, system 100 may be implemented as part of another photolithography control system or as part of stepper control system. System 100 receives a fill pattern 140 for a metal level to be produced as part of a wafer, and a geographic map 142 of an underlying metal level including a non-planar region 202 (FIG. 3). Geographic map 142 may be generated in any now known or later developed fashion such as that available from ASML. System 100 is coupled to a stepper 150 used for conducting photolithography. The details of stepper 150 will be described in greater detail below.

III. Operational Methodology

Figure 2:
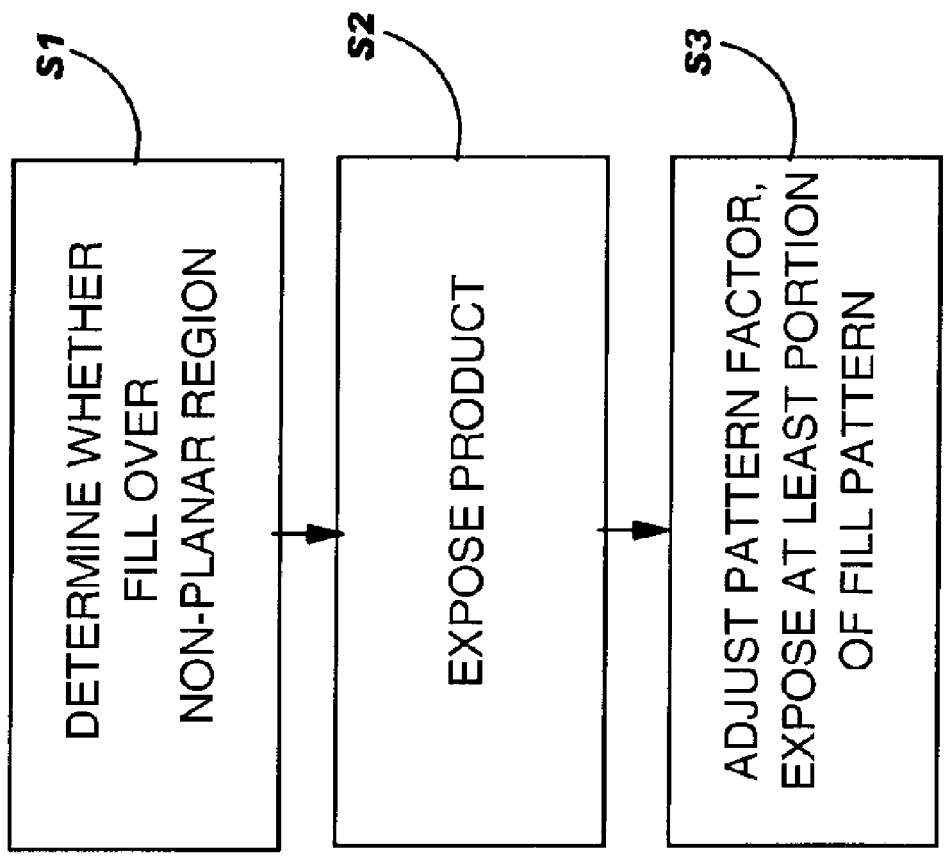
FIG. 2 shows a flow diagram of one embodiment of a method of the system of FIG. 1.
Figure 4:
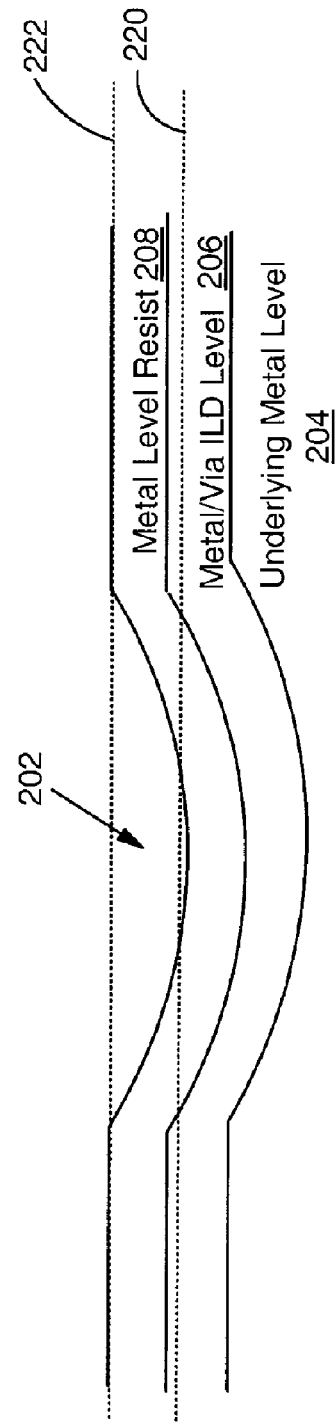
FIG. 4 shows levels layered upon the non-planar region of FIG. 3.
Figure 5:
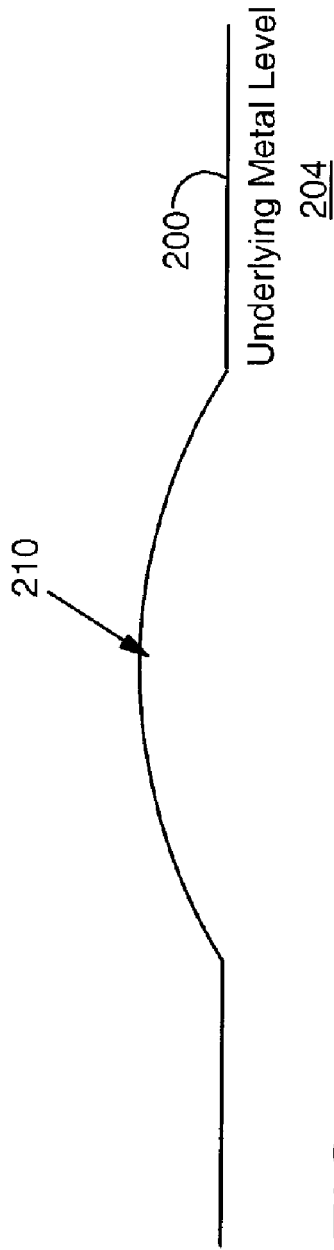
FIG. 5 shows a non-planar region in a wafer surface in the form of a bump.

Turning to FIG. 2, a flow diagram of one embodiment of a method of correcting a non-planar region during fabrication of a semiconductor product on a wafer is shown. For purposes of description, one illustrative case is shown in FIG. 3 in which a wafer surface 200 coming into a non-first metal level lithography step includes a non-planar region 202. "Metal level" as used herein is a non-first metal level (e.g., M2 and above), an underlying metal level 204 (e.g., M1) having already been fabricated. In this case, non-planar region 202 is a "low" spot, or depression, caused perhaps by a pattern factor at that location for underlying metal level 204 being higher than in surrounding areas, resulting in dishing during chemical mechanical polishing (CMP). As shown in FIG. 4, a metal or via interlayer dielectric layer (ILD) level 206 deposition replicates non-planar region 202 and a metal level resist 208 may not planarize non-planar region 202 because it is over too large a range. As shown in FIG. 5, it should also be understood that a non-planar region 210 may be in the form of a raised spot, or bump. Note that FIGS. 3-5 are not drawn to scale. The following description shall refer to only FIG. 3, unless otherwise states, for clarity.

Due to the complexity of conventional semiconductor devices, there is no guarantee that fill pattern only will be placed over non-planar region 202 in higher metal levels. Accordingly, allowing non-planar region 202 to remain may result in a process problem, e.g., with lithography at via level V2 or upper metal levels M3 and above, in which, for example, the product images do not print the same over non-planar region 202 as in the surrounding higher areas. The "product," as used herein refers to electronic circuitry used by the final semiconductor device. Alternatively, even if there was no problem with via level V2 or upper metal levels M3 and above, a metal puddle at upper metal levels' CMP may be left above non-planar region 202. The amount of dishing in non-planar region 202 (i.e., the depth of the depression with respect to the surrounding area) may become worse after metal level 204.

Returning to FIG. 2, in conjunction with FIG. 4, one embodiment of a method of correcting non-planar region 202 during fabrication of a semiconductor product on a wafer will now be described.

Figure 6:
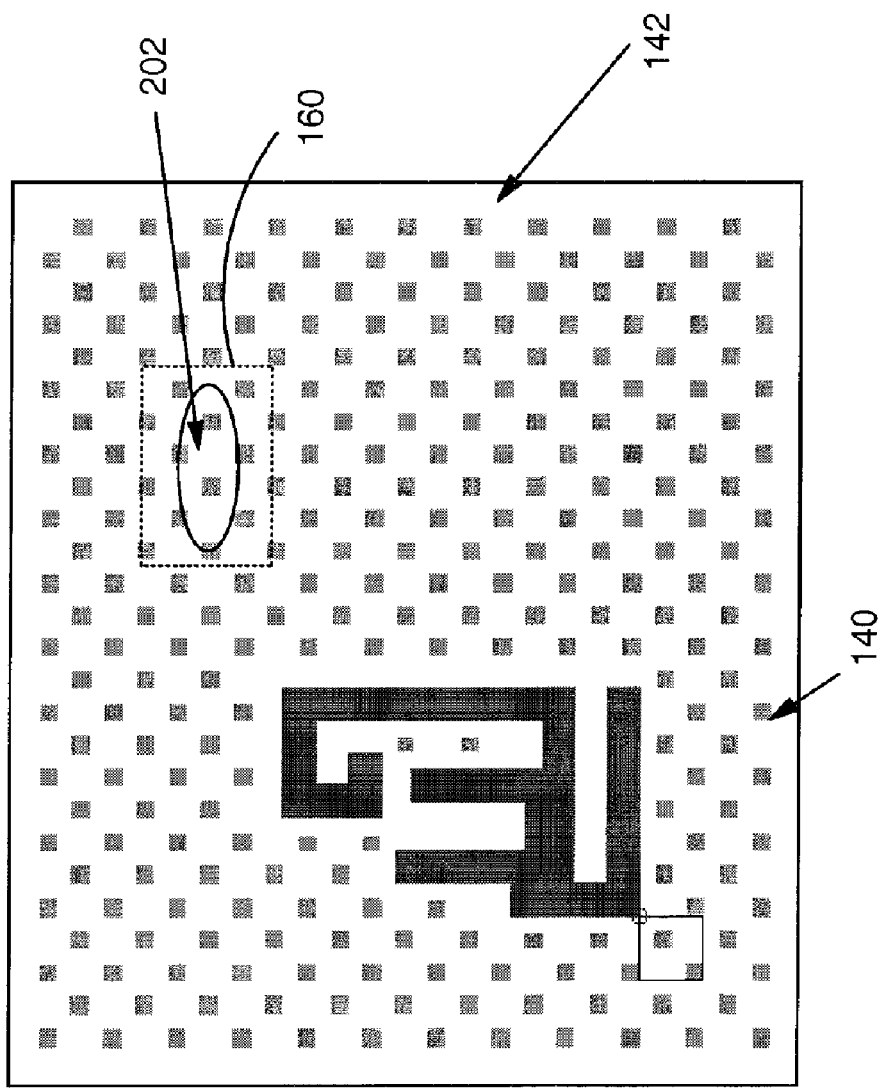
FIG. 6 shows a fill pattern superimposed over a geographic map of a wafer surface.

In a first step S1, fill pattern determinator 130 determines whether a fill pattern 140 for metal level 204 above non-planar region 202 includes a portion over the non-planar region. FIG. 6 shows a plan view of fill pattern 140 (greatly simplified) superimposed over geographic map 142. Geographic map 142 includes an indication of the location of non-planar portion 202. As shown, a portion 160 of fill pattern 140 places fill over non-planar region 202.

In a preferred second step S2, a product exposure of resist 208 for metal level 206 to be formed over underlying metal level 204 including the non-planar region 202 is first conducted. Again, "product" refers to electronic circuitry used by the final semiconductor device. The product exposure may include none of fill pattern 140 or any of fill pattern 140 that is not part of portion 160 (FIG. 6), i.e., any of fill pattern 140 that is not to be adjusted to correct non-planar region 202. That is, at least one fill pattern exposure of the resist is conducted separate from (and after) a product exposure of the resist. In an alternative embodiment, the fill pattern exposure can be performed before the product exposure, if desired. Even though the use of a separate exposure step for at least portion 160 reduces photolithography throughput for a process somewhat at metal level 206, step S2 would perhaps need to be used only at one or two levels. The reticle used for the at least portion 160 of fill pattern 140 is less expensive to make than a product reticle because it does not require extensive inspection of critical structures as for a product reticle, and small defects in the fill areas do not need to be repaired. Also, alignment between the fill shapes and the product pattern is not critical since the fill shapes are typically at a very safe distance from the product pattern.

In a third step S3, in the case that portion 160 (FIG. 6) of fill pattern 140 is to be placed over non-planar region 202, adjuster 132 adjusts a pattern factor for exposure of portion 160 of fill pattern 140 on resist 208 to correct non-planar region 202. As used herein, "pattern factor" indicates how portion 160 is exposed in resist 208, and as a result how portion 160 prints using resist 208. Step S3 includes conducting a separate exposure (from the product exposure) of resist 208 with at least portion 160 of fill pattern 140 for metal level 206, as adjusted.

Adjuster 132 may adjust the pattern factor in a variety of ways. One embodiment uses a "focus sensitive process," meaning the adjustments to the pattern factor of portion 160 are based on focusing issues of stepper 150. That is, adjuster 132 adjusts stepper 150, which is used for exposing portion 160 of fill pattern 140 on resist 208. A conventional stepper uses focus sensors along the slit when scanning to determine a "best focus plane" along the slit. FIG. 4 shows an illustrative best focus plane 220. Typically, a best focus plane 220 is determined by taking the spatial position of the top of resist 208 along the slit at various sensor spots, and the stepper then computes best average focal plane 220. In this embodiment, adjuster 132 adjusts stepper 150 by having the stepper perform at least one of the following. First, provide an offset in a z-direction for exposure with respect to best focus plane 220. Second, tilt an exposure plane with respect to best focus plane 220 by a controlled amount. Stepper 150 can therefore be made to expose portion 160 in an adjusted focal plane 222 (FIG. 4) even though best focus plane 220 was determined by the stepper to be the best average focal plane (the image would have been exposed in best focal plane 220). The metal fill shapes of portion 160 exposed in non-planar region 202 will be out of focus by a certain amount because of one or more of the above adjustments by adjuster 132. Depending on the details of the lithography process, they can be printed small (such that metal pattern factor is reduced, assuming a positive resist with a copper damascene process) or not printed at all. In such a manner, the pattern factor in those areas can be reduced by a certain controlled amount, with the amount of reduction being a function of the depth/height of non-planar region 202, as desired. For example, moderately low spots (depressions) could have smaller than nominal fill shapes printed, very low spots (depressions) could have no fill shapes at all printed, etc.

If the low spots (depressions) are lower at the wafer edge versus center, a greater adjustment in the pattern factor can be made automatically at the edge versus center. There are various other ways to tune the focus sensitivity of the printing of the metal fill shapes. For example, the following could be altered: the focus sensitivity, the illumination conditions, or the design of the fill shapes, i.e., certain shapes are more sensitive to printing as a function of focus than others.

There are also other embodiments for achieving a similar result, although in general they are more software intensive and less "automatic" than the focus sensitive lithography embodiment explained above. In this case, adjuster 132 may adjust a shutter of stepper 150 (not shown, but conventional) to expose an area of resist 208 commensurate with non-planar region 202 differently than the rest of the resist. To illustrate the advantages of this embodiment, consider that modern steppers can produce a complete focus map of a wafer surface. Assume a macroscopic area on the chip (perhaps a certain logic block several millimeters square in size which has lower than average metal density) is identified as being a higher, non-planar region 210 (bump in FIG. 5) than the surrounding area after a first (underlying) metal level 204 (M1) CMP. Also assume that an initial lot is processed which demonstrates that this bump becomes even higher than the surrounding area after metal level 206 (M2) CMP, leading to eventual process problems as described above. In some cases, the bump may exhibit significant variation in height or shape across a wafer, or from wafer to wafer, or from lot to lot. In this case, it may be advantageous to correct non-planar region 210 during metal level 204 (M2) lithography, but only on certain lots/wafers/chips to prevent the topography from becoming worse. In this case, adjuster 132 adjusting a shutter of stepper 150 (not shown, but conventional) to expose an area of resist 208 commensurate with non-planar region 210 differently than the rest of the resist may be employed. In other words, the shutters are used to print metal fill only in non-planar region 202. Alternatively, adjuster 132 could adjust the pattern factor by conducting: a first exposure of all of fill pattern 140, including portion 160, for the metal level 204 on resist 208 (i.e., without shutters), and then conduct a second exposure exposing only portion 160 of fill pattern 140 on resist 208 (i.e., with the shutters only in non-planar (bump) region 210 to increase metal pattern factor there. In some cases, the pattern factor might be increased by simple virtue of the metal fill shapes printing larger from the double exposure dose. Alternatively, if the metal fill pattern is designed properly, the pattern factor could be increased by a controlled and variable amount using an alignment offset to expose the second metal fill pattern. That is, for the second exposure, the same reticle is used but fill pattern 140 is translated in the x and/or y direction for exposure, assuming that the fill shapes are sufficiently far from product images to prevent shorting to product.

Imposing an alignment offset may also be employed alone for subtle additions/subtractions of metal fill shapes over non-planar region 202, if desired.

Figure 7:
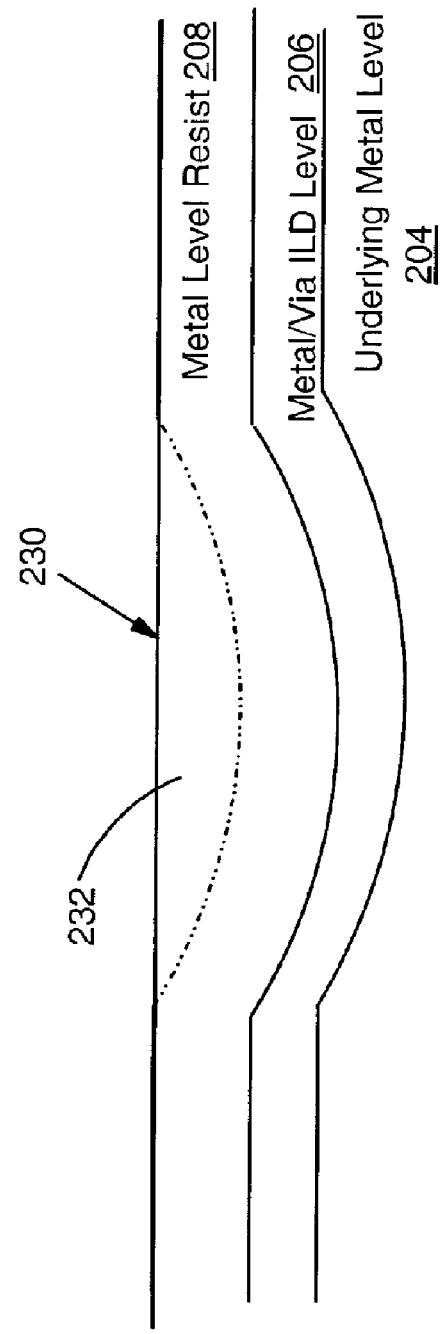
FIG. 7 shows a wafer surface corrected according to the invention.

FIG. 7 illustrates a wafer having a corrected non-planar region 230, in which metal fill shapes 232 are used to correct the non-planar region (shown in phantom). While FIG. 7 shows the plane of exposure for the metal fill even with the top of resist 208, it may be depressed slightly inside the resist, or raised slightly higher than the top of the resist. For the example topographic depression 202 shown, the plane of exposure is higher than the focal plane for the product exposure. In any of the above-described embodiments, an amount of adjusting is dependent on a size (i.e., depth, height, range, etc.) of non-planar region 202. The decision on how many levels to implement the invention for a particular chip would depend on a cost of manufacturing versus yield benefit analysis.

IV. Conclusion

It is understood that the order of the above-described steps is only illustrative. To this extent, one or more steps can be performed in parallel, in a different order, at a remote time, etc. Further, one or more of the steps may not be performed in various embodiments of the invention.

It is understood that the present invention can be realized in hardware, software, a propagated signal, or any combination thereof, and may be compartmentalized other than as shown. Any kind of computer/server system(s)- or other apparatus adapted for carrying out the methods described herein—is suitable. A typical combination of hardware and software could be a general purpose computer system with a computer program that, when loaded and executed, carries out the respective methods described herein. Alternatively, a specific use computer, containing specialized hardware for carrying out one or more of the functional tasks of the invention, could be utilized. The present invention also can be embedded in a computer program product or a propagated signal, which comprises all the respective features enabling the implementation of the methods described herein, and which—when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form. Furthermore, it should be appreciated that the teachings of the present invention could be offered as a business method on a subscription or fee basis. For example, the system and/or computer could be created, maintained, supported and/or deployed by a service provider that offers the functions described herein for customers. That is, a service provider could offer the functionality described above.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of correcting a non-planar region during fabrication of a semiconductor product on a wafer, the method comprising the steps of:
   determining whether a fill pattern for a metal level above the non-planar region includes a portion over the non-planar region; and
   in the case that a portion of the fill pattern is to be placed over the non-planar region, adjusting a pattern factor for exposure of the portion of the fill pattern on a resist to correct the non-planar region.

2. The method of claim 1, further comprising the step of conducting at least one fill pattern exposure of the resist separate from a product exposure of the resist.

3. The method of claim 2, wherein the product exposure occurs prior to the at least one fill pattern exposure.

4. The method of claim 1, wherein the adjusting step includes adjusting a stepper used for exposing the portion of the fill pattern on the resist.

5. The method of claim 4, wherein the stepper adjusting step includes at least one of:
   providing an offset in a z-direction;
   tilting an exposure plane with respect to a plane of best focus;
   adjusting a shutter of the stepper to expose an area of the resist commensurate with the non-planar region differently than the rest of the resist; and
   imposing an alignment offset.

6. The method of claim 1, wherein the adjusting step includes conducting:
   a first exposure of all of the fill pattern, including the portion, for the metal level on the resist; and
   a second exposure exposing only the portion of the fill pattern over the non-planar region on the resist.

7. The method of claim 6, wherein the second exposure includes an alignment offset.

8. The method of claim 1, wherein an amount of adjusting is dependent on a size of the non-planar region.

9. A system for correcting a non-planar region during fabrication of a semiconductor product on a wafer, the system comprising:
   means for determining whether a fill pattern for a metal level above the non-planar region includes a portion over the non-planar region; and
   means for adjusting a pattern factor for exposure of the portion of the fill pattern on a resist to correct the non-planar region in the case that a portion of the fill pattern is to be placed over the non-planar region.

10. The system of claim 9, further comprising means for conducting at least one fill pattern exposure of the resist separate from a product exposure of the resist.

11. The system of claim 10, wherein the product exposure occurs prior to the at least one fill pattern exposure.

12. The system of claim 9, wherein the adjusting means includes means for adjusting a stepper used for exposing the portion of the fill pattern on the resist.

13. The system of claim 12, wherein stepper adjusting means performs at least one of:
   providing an offset in a z-direction;
   tilting an exposure plane with respect to a plane of best focus;
   adjusting a shutter of the stepper to expose the non-planar region differently than the rest of the wafer; and
   imposing an alignment offset.

14. The system of claim 8, wherein the adjusting means conducts:
   a first exposure of all of the fill pattern, including the portion, for the metal level on the resist; and
   a second exposure exposing only the portion of the fill pattern over the non-planar region on the resist.

15. The system of claim 14, wherein the second exposure includes an alignment offset.

16. The system of claim 9, wherein an amount of adjusting by the adjusting means is dependent on a size of the non-planar region.

17. A method of correcting a non-planar region during fabrication of a semiconductor product on a wafer, the method comprising the steps of:
   conducting a product exposure of a resist for a metal level to be formed over an underlying metal level including the non-planar region; and
   conducting a separate exposure of the resist with at least a portion of a fill pattern for the metal level, the portion including fill above the non-planar region, to correct the non-planar region.

18. The method of claim 17, further comprising the step of adjusting a pattern factor of the portion of the fill pattern for the separate exposure.

19. The method of claim 18, wherein the adjusting step includes adjusting a stepper used for conducting the second exposure to conduct at least one of:
   providing an offset in a z-direction;
   tilting an exposure plane with respect to a plane of best focus;
   adjusting a shutter of the stepper to expose the non-planar region differently than the rest of the wafer; and
   imposing an alignment offset.

20. The method of claim 18, wherein the adjusting step includes conducting the separate exposure by:
   conducting a first exposure of the resist including all of the fill pattern for the metal level including the portion of the fill pattern; and
   conducting a second exposure of the resist including only the portion of the fill pattern over the non-planar region.

* * * * *